United States Patent [19]

Kühnle et al.

[11] Patent Number: 5,515,431
[45] Date of Patent: May 7, 1996

[54] SPEAKERPHONE DEVICE WITH AUXILIARY CIRCUIT FOR ELIMINATING CLICKING AT POWER-ON

[75] Inventors: Joachim Kühnle, Erlenbach; Wolfgang Röper, Wolpertshausen; Jürgen Schnabel, Leingarten, all of Germany

[73] Assignee: TEMIC TELEFUNKEN microelectronic GmbH, Heilbronn, Germany

[21] Appl. No.: 290,110

[22] Filed: Aug. 15, 1994

[30] Foreign Application Priority Data

Sep. 2, 1993 [DE] Germany .................. 43 29 638.6

[51] Int. Cl.⁶ ........................................... H04M 1/02
[52] U.S. Cl. .................. 379/388; 379/395; 379/421
[58] Field of Search ........................ 379/387, 388, 379/395, 419, 420, 421; 381/106, 107, 108, 117

[56] References Cited

U.S. PATENT DOCUMENTS

| | | | |
|---|---|---|---|
| 3,706,852 | 12/1972 | Angus | 379/395 |
| 4,025,728 | 5/1977 | Jacobson | 379/420 |
| 4,304,969 | 12/1981 | Walla | 379/395 |
| 4,371,841 | 2/1983 | Eckert et al. | 330/51 |
| 4,400,501 | 8/1983 | Jacobson | 379/420 |
| 4,640,993 | 2/1987 | Whittaker | 379/383 |
| 5,070,527 | 12/1991 | Lynn | 379/395 |
| 5,191,606 | 3/1993 | Juang | 379/387 X |
| 5,406,636 | 4/1995 | Yamada et al. | 381/106 |
| 5,436,588 | 7/1995 | Ghaffaripour | 327/538 |

FOREIGN PATENT DOCUMENTS

| | | |
|---|---|---|
| 2802484 | 8/1978 | Germany . |
| 2806852 | 8/1978 | Germany . |
| 2931144 | 8/1979 | Germany . |
| 3006628 | 8/1981 | Germany . |
| 3129506 | 7/1982 | Germany . |
| 3345703 | 6/1985 | Germany . |
| 63-009318 | 1/1988 | Japan .................. 379/421 |
| 4-288715 | 10/1992 | Japan . |

OTHER PUBLICATIONS

"An Integrated Telephone Speech Circuit Including a Line Fed Loudspeaker Amplifier", K. Eberhardt et al., ESSCI.2C '81, Sep. 1981, pp. 47–49.
WIRSUM, Siegfried: Verstärkerbau mit integrierten Schaltungen, RPB electronic–taschenbücher Nr. 331, Franzis–Verlag GmbH, München, 5.Aufl., S.74–75.
Krämer; Moses: TN–Terminals im neuen Design. In: TN–Nachrichten, 1987, H.91, S.7–11.

Primary Examiner—Jeffery Hofsass
Assistant Examiner—Scott L. Weaver
Attorney, Agent, or Firm—Spencer & Frank

[57] ABSTRACT

A speakerphone for a telephone circuit includes an output stage that comprises a loudspeaker amplifier coupled to a loudspeaker through a coupling capacitor. An auxiliary circuit includes a reference input element that provides first and second reference voltages which are used to charge the coupling capacitor to a given level prior to the input signal being coupled to the loudspeaker through the coupling capacitor to insure a click-free switch-on of the loudspeaker.

8 Claims, 2 Drawing Sheets

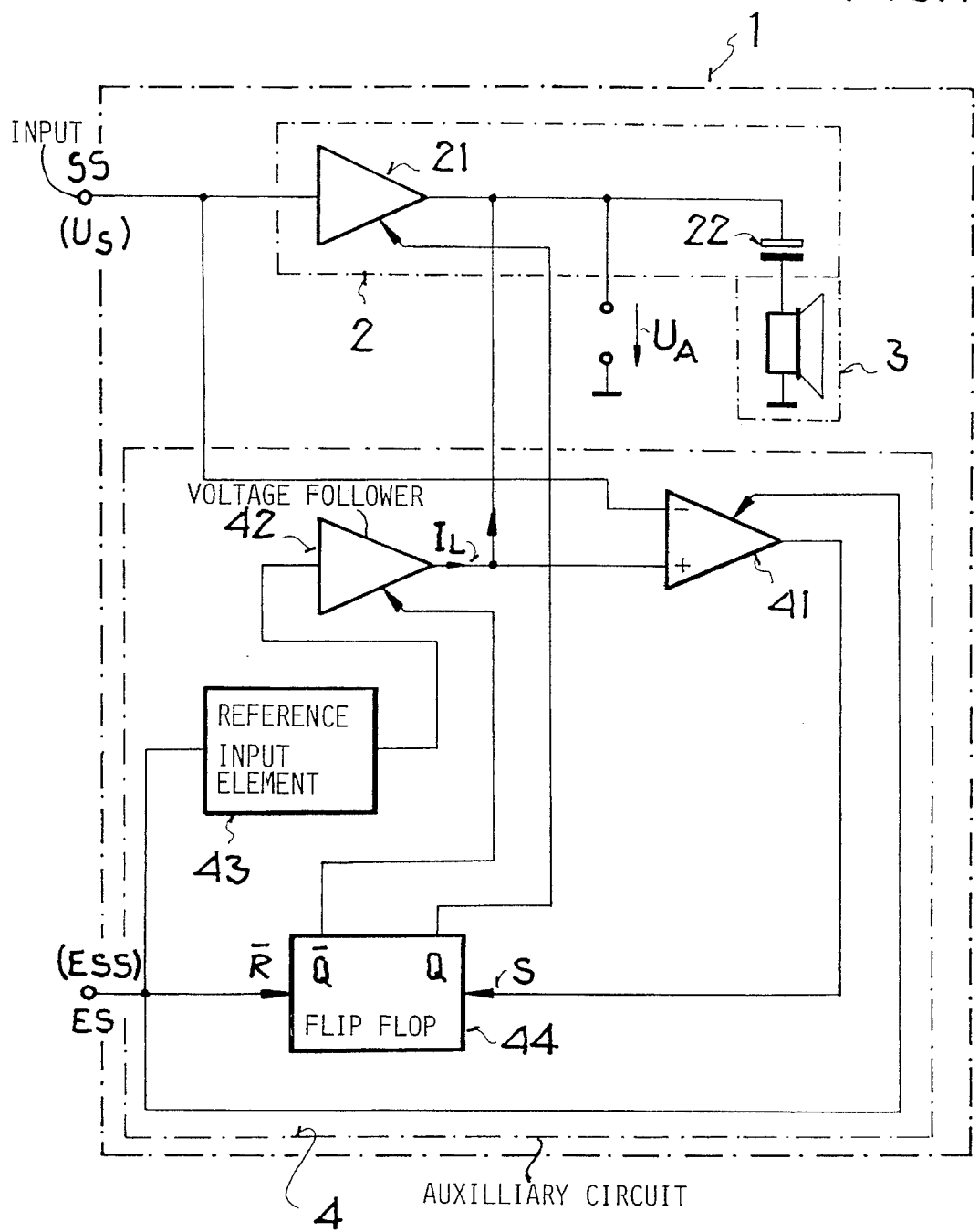

SPEAKERPHONE DEVICE WITH AUXILIARY CIRCUIT FOR ELIMINATING CLICKING AT POWER-ON

BACKGROUND OF THE INVENTION

Open-listening, or speakerphone, devices are known for telephone circuits (telephone speaking circuits, intercom systems, radio devices etc.) comprising an amplifier circuit as an open-listening (speakerphone) output stage and a loudspeaker. Unipolar amplifier circuits with asymmetrical output (having an amplifier element and a coupling capacitor for isolating the direct current) have not only less complexity and a smaller space requirement than symmetrical open-listening output stages but also the advantage of greater current efficiency, which means that with the commonly used loudspeaker impedances of 30 to 100 $\Omega$, they have a greater output power in the critical range of low supply currents.

When using these open-listening output stages, it is however a disadvantage that on switching on the loudspeaker a loud and disturbing clicking noise can be heard that is caused by the high current surge when the coupling capacitor is suddenly charged.

SUMMARY OF THE INVENTION

The object of the invention is to provide a simple open-listening device in which the disturbing clicking noises do not occur when switching on the loudspeaker. Pursuant to the invention this object is achieved by the features of the invention wherein there is provided a speakerphone device for a telephone circuit, comprising: an output stage for receiving an input voltage signal and including: a loudspeaker amplifier having an input coupled to the input signal, an output for supplying an output signal and a control input for receiving a control signal for activating the loudspeaker amplifier; a coupling capacitor having a first terminal coupled to the output signal of the loudspeaker amplifier and a second terminal; and a loudspeaker connected to the second terminal of the coupling capacitor; and an auxiliary circuit having an input for receiving a speakerphone switch-on signal and having an output coupled to the first terminal of the coupling capacitor of the output stage for supplying a charging current to the coupling capacitor for charging the coupling capacitor to a first voltage which is below a threshold voltage prior to application of the switch-on signal and being responsive to an application of the switch-on signal for further charging the coupling capacitor, the auxiliary circuit including means having first and second inputs coupled to the input voltage signal and the voltage of the coupling capacitor, respectively, and having an output connected to the control input of the loudspeaker amplifier for producing the control signal when there is correspondence between the input voltage signal and the voltage at the coupling capacitor.

The invention is based on the fact that when a d.c. voltage is applied to the loudspeaker below a specific voltage threshold value (for example 20 mV) this is practically inaudible. Depending on the resistance of the loudspeaker, this corresponds to a defined current threshold (for example a value of approximately 400 µA with 20 mV DC and a resistance of 50 $\Omega$). In the open-listening device described here an auxiliary circuit comprising a reference input element, memory element, current-limited voltage follower amplifier and comparing element is used to implement the following measures:

on applying the operating voltage to the telephone circuit, the coupling capacitor is precharged up to a specific charged state with a charging current that is below the current threshold (this precharging operation is therefore not noticed by the user). The charged state of the capacitor is selected firstly in accordance with the offset of the input signal voltage and secondly in accordance with the maximal permissible time between receipt and transfer of a switch-on command for the loudspeaker (or for the open-listening output stage;

when switching on the loudspeaker, the precharged capacitor is charged further by the "non-critical" charging current;

the input signal is output to the loudspeaker only when the voltage at the output of the amplifier element of the open-listening output stage has reached the input signal voltage.

The open-listening device incorporates several advantages:

because the charging currents for charging the coupling capacitor are selected below the "critical" current threshold value, the loudspeaker can always be switched on without any clicking noise where any asymmetrical open-listening output stages are used, especially those used in telephone circuits;

because the charging process of the coupling capacitor is performed in two stages (precharging of the coupling capacitor to the voltage that ensures click-free switch-on, and final charging as soon as a loudspeaker switch-on command is received), a short response time (until the input signal has been transferred to the loudspeaker) is assured;

because the coupling capacitor itself is used as a time-function element for "smooth charging", no additional external components are required if the open-listening output stage is integrated.

BRIEF DESCRIPTION OF THE DRAWINGS

One example of the invention will now be described with reference to the drawings.

FIG. 1 shows a block diagram for a telephone open-listening device according to the invention.

DETAILED DESCRIPTION OF A PREFERRED EMBODIMENT

Figure 2A:
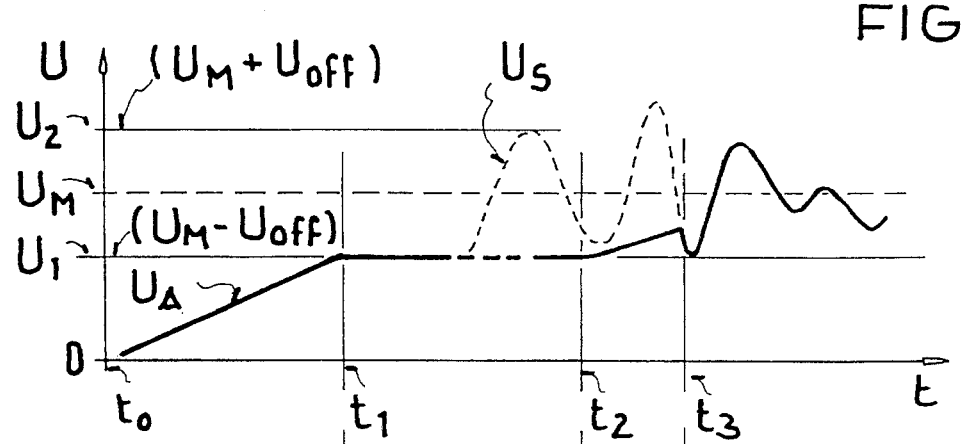
FIG. 2a is a graph which shows the variation of voltage with respect to time for various operating states of the open-listening device.

According to FIG. 1, an open-listening device 1 comprises a unipolar amplifier circuit 2 (open-listening output stage) includes an open-listening amplifier element 21, a coupling capacitor 22, and a loudspeaker 3; and an auxiliary circuit 4. The auxiliary circuit 4 includes a comparing element 41, for example in the form of a voltage comparator, a current-limited voltage follower amplifier 42, a reference input element 43 and a memory element 44, for example in the form of a flip-flop.

The switch-on signal ESS, through which the open-listening amplifier 21 of the open-listening output stage 2 and the loudspeaker 3 is activated (ESS="1") or deactivated (ESS="0"), is applied to input ES of the open-listening device 1. For this purpose, the input ES is connected to the inverting resetting input R of the flip-flop memory 44, to the input of the reference input element 43 and to the control input of the voltage comparator 41. The output of the reference input element 43 is connected to the input of the voltage follower amplifier 42 whose control input is driven by the inverting output $\overline{Q}$ of the flip-flop memory 44. Depending on the state of the switch-on signal ES, the reference input element 43 supplies two different reference values for the voltage follower amplifier 42, which delivers an output current $I_L$ with a maximum value of $I_{max}$ (this maximum value $I_{max}$ is below the "critical" current threshold value $I_S$). The output of the voltage follower amplifier 42 is connected to the non-inverting input (+) of the voltage comparator 41, to the output of the open-listening amplifier 21 and to the coupling capacitor 22. The input SS of the open-listening device 1 for the signal voltage $U_S$ is connected to the input of the open-listening amplifier 21 and to the inverting input (−) of the voltage comparator 41. The voltage comparator 41 thus compares the input signal voltage $U_S$ with the voltage $U_A$ at the output of the open-listening amplifier 21. The setting input S of the flip-flop memory 44 is driven by the output signal of the voltage comparator 41 in accordance with this voltage comparison and switched by the non-inverting output Q of the flip-flop memory 44 (which is connected to the control input of the open-listening amplifier 21) of the open-listening amplifier 21. When the signal has been transferred through the open-listening amplifier 21, the input signal voltage $U_S$ is output to the loudspeaker 3 via the coupling capacitor 22. The auxiliary circuit 4 can be integrated in an integrated circuit (IC) together with the open-listening amplifier 21.

Figure 2B:
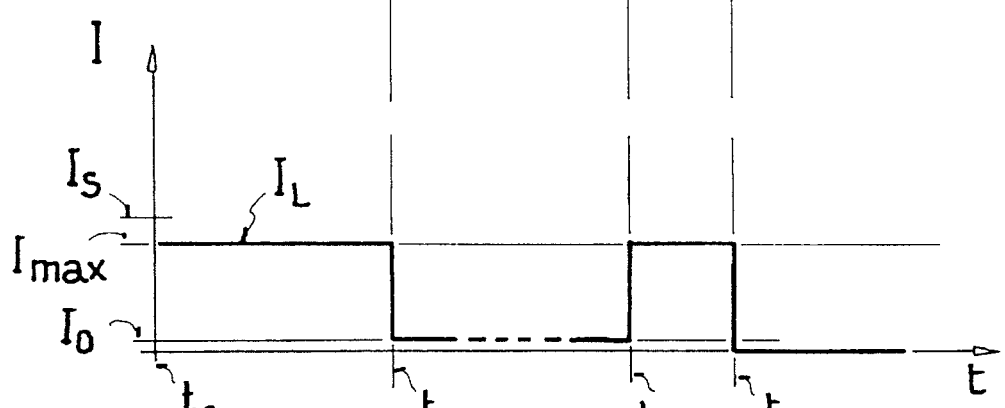
FIG. 2b is a graph which shows variation of current with respect to time for various operating states of the open-listening device.

The time sequences for the various operating states of the open-listening device will now be described with reference to FIG. 2:

When switching on the telephone (on picking up the receiver) at time $t_0$, the voltage supply to the open-listening device 1 is provided. There is no information at the switch-on input ES (ESS="0"). The open-listening amplifier 21 driven by the non-inverting output Q of the flip-flop memory 44 is deactivated, as is the voltage comparator 41. Consequently the input signal $U_S$ applied to the signal input SS is not output to the loudspeaker 3. The coupling capacitor 22 is charged with charging current $I_L$ through the current-limited voltage follower amplifier 42 (the charging current $I_L$ is limited to the maximum permitted value of $I_{max}$ on account of the current limitation, but is less than the "critical" current threshold value $I_S$, e.g. $I_L < I_{max} = 400$ μA). The end point for the charging operation is set by the reference input element 43 by specifying a maximum voltage $U_1$ for the output voltage $U_A$ of the open-listening amplifier 21. The voltage $U_1$ (first threshold value) is given according to the (known) mean value $U_M$ of the input signal voltage $U_S$ and with allowance being made for the maximum value of the offset $U_{off}$ in the negative direction $|U_{off,max}|$ of the stages connected in front of it ($U_1 < U_M - |U_{off,max}|$). For example, the voltage $U_S$ of the input signal is between 0 and 6.4 V ($U_M = 3.2$ V); the value of the offset $U_{off}$ for instance is less than 0.4 V. The first threshold value $U_1$ (determined by the reference input element 43) can therefore be 2.8 V.

At time $t_1$ (for example, after 400 ms), the voltage $U_A$ at the output of the open-listening amplifier 21 reaches the first threshold value $U_1$ established by the reference input element 43 (the stable state has been reached).

The charging process of capacitor 22 is then concluded with the charging current $I_L$ determined by the current-limited voltage follower amplifier 42 (only the leakage current $I_O$ still flows). The voltage $U_A$ is thus maintained at the first threshold value $U_1$.

At time $t_2$, the loudspeaker is to be switched on (by pressing a button), and then a switch-on command is applied to input ES (ESS="1"). This causes the reference input element 43 to switch over and supply a (larger) voltage $U_2$ as the second threshold value ($U_2 > U_M + |U_{off,max}|$ for example $U_2 = 3.2 + 0.4$ V=3.6 V). The coupling capacitor 22 is charged further with the charging current $I_L$ via the voltage follower amplifier 42. At the same time, the voltage comparator 41 is activated. This compares the input signal voltage $U_S$ at the signal input SS and the output voltage $U_A$ from the voltage follower amplifier 42 and the open-listening amplifier 21 with each other. The output from the voltage comparator 41 remains at logical "0" until the output current $I_L$ from the voltage follower amplifier 42 has charged the coupling capacitor 22 to the point where the input voltage $U_S$ and the output voltage $U_A$ from the open-listening amplifier 21 correspond.

At time $t_3$, the voltage $U_A$ at the output of the open-listening amplifier 21 reaches the level of the input signal voltage $U_S$ and then the output signal from the voltage comparator 41 (logical "1") causes the flip-flop memory 44 to be set. The open-listening amplifier 21 is now activated from the non-inverting output Q of the flip-flop memory 44, causing the open-listening output stage 2 and the loudspeaker 3 to be switched on without a click. By appropriately specifying the voltage threshold values $U_1$ and $U_2$, it is ensured that the loudspeaker 3 is reliably switched on (the voltage $U_A$ definitely reaches the level of the input voltage $U_S$) and that the switch-on time of the loudspeaker 3 can be within the required period of time (for example 100 ms) after pressing the button. Simultaneously at time $t_3$, the voltage follower amplifier 42 is again deactivated via the inverting output $\overline{Q}$ of the flip-flop memory 44, i.e. the charging process of capacitor 22 with charging current $I_L$ is then concluded.

In order to again switch off (deactivate) the open-listening output stage 2 and the loudspeaker 3, a switch-off signal must be applied at input ES (ESS="0"), causing all circuit components to revert to the state described on switching on the telephone (time $t_0$).

What is claimed is:

1. A speakerphone device for a telephone circuit, comprising:

an output stage for receiving an input voltage signal and including:
  a loudspeaker amplifier having an input for receiving the input signal, an output for supplying an output signal and a control input for receiving a control signal for activating the loudspeaker amplifier;
  a coupling capacitor having a first terminal coupled to the output of the loudspeaker amplifier and a second terminal; and
  a loudspeaker connected to the second terminal of the coupling capacitor; and an auxiliary circuit having an input for receiving a speakerphone switch-on signal and having an output coupled to the first terminal of the coupling capacitor of the output stage for supplying a charging current to the coupling capacitor for charging the coupling capacitor to a first voltage which is below a threshold voltage prior to application of the switch-on signal and being responsive to an application of the switch-on signal for further charging the coupling capacitor, the auxiliary circuit including means having first and second inputs for receiving the input voltage signal and the voltage of the coupling capacitor, respectively, and having an output connected to the control input of the loudspeaker amplifier for producing the control signal when there is correspondence between the input voltage signal and the voltage at the coupling capacitor.

2. A speakerphone device for a telephone circuit, comprising:

an output stage for receiving an input signal and including:
  a loudspeaker amplifier having an input for receiving the input signal, an output for supplying an output signal and a control input for receiving a first control signal for activating the loudspeaker amplifier;
  a coupling capacitor having a first terminal coupled to the output of the loudspeaker amplifier and a second terminal; and
  a loudspeaker connected to the second terminal of the coupling capacitor; and an auxiliary circuit having an input for receiving a speakerphone switch-on signal and including:
  a reference input element having an input connected to the input of the auxiliary circuit and an output for producing first and second reference voltages as a function of off and on states, respectively, of the speakerphone switch-on signal;
  a current limited voltage follower amplifier having an input connected to the output of the reference input element, a control input for receiving a second control signal and an output connected to the first terminal of the coupling capacitor for supplying a charging current to the coupling capacitor in dependence of the first and second reference voltages, respectively;
  a comparing element having a first input for receiving the input signal of the output stage, a second input coupled to the output of the loudspeaker amplifier and the first terminal of the coupling capacitor, a control input coupled to the input of the auxiliary circuit and an output for producing a third control signal in response to the on state of the switch-on signal and a correspondence between the input signal and a voltage at the output of the loudspeaker amplifier; and
  a memory element having a setting input coupled to the third control signal at the output of the voltage comparator, an inverting resetting input coupled to the input of the auxiliary circuit, an inverting output for producing the second control signal and being connected to the control input of the voltage follower amplifier, and a non-inverting output for producing the first control signal in response to the third control signal at the setting input of the memory element and being connected to the control input of the loudspeaker amplifier.

3. The speakerphone device according to claim 2, wherein the input signal to the output stage is an input voltage and the first and second reference voltages depend on the input voltage and an offset voltage of stages connected in front of the input of the output stage.

4. The speakerphone device according to claim 2, wherein the charging current of the voltage follower amplifier has a maximum value selected to be smaller than a current threshold value.

5. The speakerphone according to claim 2, wherein the memory element comprises a flip-flop.

6. The speakerphone device according to claim 2, wherein the comparing element comprises a voltage comparator.

7. The speakerphone device according to claim 2, wherein the auxiliary circuit is integrated in an integrated circuit together with the loudspeaker amplifier.

8. The speakerphone device according to claim 2, wherein the loudspeaker amplifier is a unipolar amplifier.

* * * * *